United States Patent [19]
McCurrach

[11] Patent Number: 5,223,678
[45] Date of Patent: Jun. 29, 1993

[54] REPLACEMENT ELEVATOR CALL BUTTON UNIT

[75] Inventor: Robert A. McCurrach, Burnaby, Canada

[73] Assignee: S.B.M. Electronic Specialties Ltd., Burnaby, Canada

[21] Appl. No.: 736,833

[22] Filed: Jul. 29, 1991

[51] Int. Cl.$^5$ .............................. B66B 3/00; G08B 5/36
[52] U.S. Cl. ................................ 187/121; 340/815.13; 340/332; 315/129; 315/136; 200/314
[58] Field of Search .................. 340/381, 815.13, 332; 187/121, 129, 29 R, 127; 315/135, 129; 200/314

[56] References Cited

U.S. PATENT DOCUMENTS

| | | | |
|---|---|---|---|
| 3,307,071 | 2/1967 | Diamond | 340/332 |
| 4,126,849 | 11/1978 | Mente et al. | 340/332 |
| 4,951,787 | 8/1990 | Lind et al. | 187/121 |

*Primary Examiner*—Steven L. Stephan
*Assistant Examiner*—Robert E. Nappi
*Attorney, Agent, or Firm*—Barrigar & Oyen

[57] ABSTRACT

A replacement elevator call button unit which may be electrically connected to an elevator controller having first and second power supply lines and having an elevator call registering terminal. The replacement unit includes an electronic switch (preferably a silicon controlled rectifier) which is electrically connectible between the power supply lines. A normally open push button is electrically coupled to the switch in order to switch the first switch from an inoperative state in which current flow between the power lines is prevented, to an operative state in which such current flow is permitted. A voltage divider is provided for electrical connection across the elevator call registering terminal, in series with the switch means. Cross firing between two or more corresponding replacement units is accomplished by a second electronic switch (preferably a photo diode) optically coupled to the first switch, without requiring any additional wiring. The second switch switches the first switch inoperative state to the operative state upon application of a predetermined signal to the call registering terminal by the elevator controller. The second switch is electrically connectible between the call registering terminal and the second power supply line.

9 Claims, 2 Drawing Sheets

REPLACEMENT ELEVATOR CALL BUTTON UNIT

FIELD OF THE INVENTION

This application pertains to an elevator call button replacement unit.

BACKGROUND OF THE INVENTION

U.S. Pat. No. 4,134,107 issued Jan. 9, 1979 for an invention of Miller et al. entitled "Replacement Elevator Call Button Assembly" discloses a direct replacement unit for an Otis Elevator touch button assembly. Series-connected zener diodes are used to drop the voltage across the power supply lines which couple the call button assembly to the Otis Elevator controller. The voltage drop is equivalent to that sustained by an original equipment Otis Elevator gas tube type elevator call button assembly, thereby allowing the Miller et al. device to serve as a direct replacement for an original equipment Otis Elevator touch button assembly.

Although the Miller et al. device offers a number of advantages over the original equipment Otis Elevator touch button assembly, it has some inherent disadvantages. For example, in buildings equipped with multiple elevator shafts, more than one elevator call button assembly may be provided on each floor of the building. This allows ready access to the call buttons by any one who wants an elevator car to stop for passengers at a particular floor. Conventionally, if someone presses an elevator call button on a particular floor, then that call button is illuminated to indicate that an elevator has been called; and, all corresponding buttons in any other call assemblies provided on the same floor are simultaneously illuminated. Waiting passengers are thus informed that no further call buttons need be pressed to summon an elevator to that floor.

The simultaneous illumination of the additional call buttons is accomplished by a technique called "cross firing". In the original equipment Otis Elevator touch button assembly, cross firing between the call assemblies located on a particular floor is achieved by applying a negative bias voltage to the triggers of each of the glass tube touch buttons provided on that floor, and by wiring the cathodes of each button together. When an individual touches one of the tubes, that tube fires, thereby activating the Otis Elevator controller and illuminating the touched tube to indicate that an elevator has been summoned. The negative bias trigger voltage and the cathode interconnections to the remaining tubes cause breakdown to occur between the cathodes and triggers of the remaining tubes. This in turn results in further breakdown between the anodes and cathodes of the remaining tubes, thus firing (i.e. illuminating) the remaining tubes.

In order to achieve cross firing, the Miller et al. device requires additional wires to be run between the elevator call button assemblies located on the particular floor at which cross firing is desired. Such additional wiring can be an expensive, time-consuming, laborious operation in view of the fact that the Miller et al. device is primarily intended to replace previously installed Otis Elevator touch button assemblies (i.e. workmen must gain access to the ceilings and walls adjacent the elevator shafts in order to install the additional wiring).

The present invention is also capable of serving as a direct replacement for an Otis Elevator touch button assembly, or as a direct replacement for equivalent assemblies such as the Miller et al device. Unlike the prior art replacement assemblies, the present invention requires no additional wiring in order to achieve cross firing at floors equipped with two or more elevator call button assemblies.

SUMMARY OF THE INVENTION

In accordance with the preferred embodiment, the invention provides a replacement elevator call button unit which may be electrically connected to an Otis Elevator controller having first and second power supply lines and having an elevator call registering terminal. The replacement unit includes a first electronic switch means (preferably a silicon controlled rectifier) which is electrically connectible between the power supply lines. A normally open push button is electrically coupled to the first switch in order to switch the first switch from an inoperative state in which current flow between the power lines is prevented, to an operative state in which such current flow is permitted. A voltage divider is provided for electrical connection across the elevator call registering terminal, in series with the first switch means.

An illuminating means (preferably a light emitting diode) is electrically connected to the first switch means, for illuminating the push button upon the switching from the inoperative state to the operative state.

Cross firing between two or more corresponding replacement units is accomplished by a second electronic switch means (preferably a photo diode) optically coupled to the first switch means. The second switch means switches the first switch means from the inoperative state to the operative state upon application of a first predetermined signal to the call registering terminal by the elevator controller. The second switch means is electrically connectible between the call registering terminal and the second power supply line.

The unit is reset by a third electronic switch means electrically connectible between the call registering terminal and the first switch means. The third switch means switches the first switch means from the operative state to the inoperative state upon application of a second predetermined signal to the call registering terminal by the elevator controller.

Voltage dropping means may be provided for dropping the voltage between the second power supply line and a third power supply line of the elevator controller, in those situations in which the third power supply line is used to achieve cross firing between two or more corresponding replacement units.

Advantageously, charge storage means (preferably a capacitor) may be connected across the illuminating means, to gradually extinguish the illuminating means upon switching of the first switch means from the operative state to the inoperative state.

DETAILED DESCRIPTION OF THE PREFERRED EMBODIMENT

Because the invention is intended to serve as a direct replacement for original equipment Otis Elevator touch button assemblies, it will be convenient to utilize nomenclature employed by the Otis Elevator Company. In particular, the power supply lines coupled between the Otis Elevator controller 10 (FIG. 1) and the elevator call button assembly are conventionally labelled B+ and B0. The controller's power supply applies a direct current voltage of about 130 Volts between the B+ and B0 lines. (The term "B−" is sometimes used instead of the term "B0".) The term "CAC" is conventionally used to denote the terminal used to connect the elevator call button assembly to the Otis Elevator controller call registering terminal. By applying an appropriate signal to the CAC terminal, the call button assembly signals the controller that an elevator car should be summoned to the floor at which the call button assembly is located.

Figure 1:
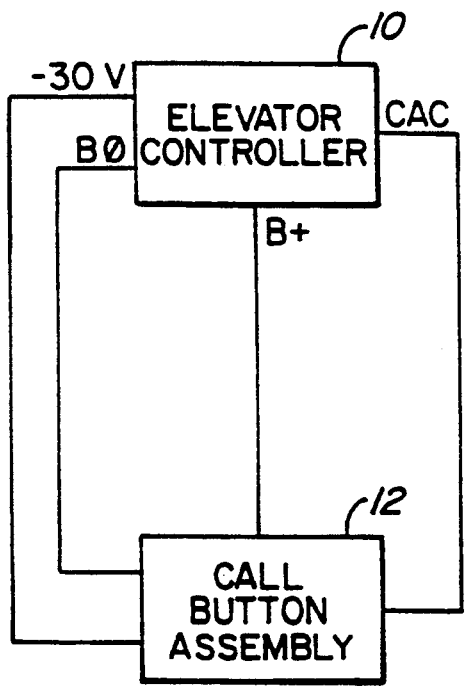
FIG. 1 is a block diagram showing a prior art elevator call button assembly coupled to a prior art elevator controller.
Figure 2:
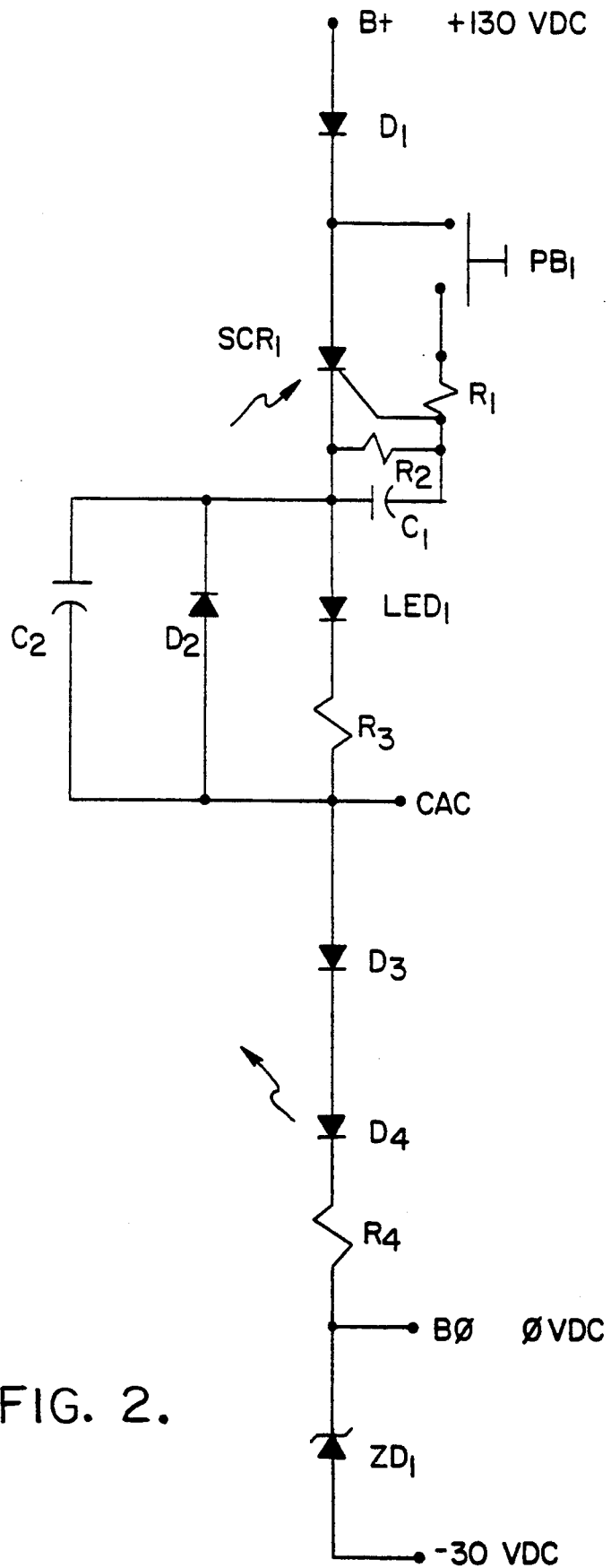
FIG. 2 is an electronic circuit schematic diagram or an elevator call button assembly constructed in accordance with the preferred embodiment of the invention.

FIG. 2 illustrates a single elevator call button assembly which may be directly substituted for prior art call button assembly 12 shown in FIG. 1. As is well known to those skilled in the art, two identical elevator call button assemblies are provided at each building floor, one for use in summoning elevators for upward travel, and the other for use in summoning elevators for downward travel. The Otis Elevator controller is provided with corresponding pairs of "up" and "down" CAC terminals, with one pair being provided for each floor of the building at which one or more paired up/down call button assemblies are located.

With reference to FIG. 2, $PB_1$ represents a normally open, wall-mounted mechanical push button provided at the floor of the building adjacent one or more elevator shafts containing elevator cars which are to be summoned to that floor when the button is pressed. When $PB_1$ is pressed, a "first electronic switch means", namely silicon controlled rectifier $SCR_1$ fires, allowing current to flow in the direction from B+ to B0. A reverse polarity blocking diode $D_1$ is provided to protect $SCR_1$. Gate biasing resistor $R_1$ provides current limiting to further protect $SCR_1$. A gate hold off network comprising hold down resistor $R_2$ and hold off capacitor $C_1$ prevents false triggering of $SCR_1$ which might otherwise be caused by rapid fluctuations on the power supply lines.

Current conducted through $SCR_1$ illuminates an "illuminating means", namely high intensity, wide dispersion light emitting diode $LED_1$, which is installed within push button $PB_1$ to illuminate the push button when it is pressed as aforesaid. Resistor $R_3$ limits current flow through the circuit to approximately 20 mA, which is the level required to attain full intensity illumination of $LED_1$ and which is the maximum level required by the Otis Elevator controller with which the invention interfaces.

Resistors $R_3$ and $R_4$ form a "voltage divider means" connected across the CAC terminal. When $SCR_1$ conducts, the voltage divider drops approximately 70 volts, thereby raising the CAC terminal to about 60 volts, which is the recommended level for application to the call registering terminal of the Otis Elevator controller.

When the CAC terminal is raised to the 60 volt level as aforesaid, current flows through reverse blocking diode $D_3$ and through a "second electronic switch means", namely photo diode $D_4$. Reverse blocking diode $D_3$ protects photo diode $D_4$ and prevents false triggering of $SCR_1$, which is optically coupled to photo diode $D_4$. If additional pairs of elevator call button assemblies are provided on the same building floor, then cross firing is accomplished via either the B0 or the −30 volt terminals of each call button assembly, depending upon the particular installation employed in the building in question. If cross firing is accomplished via the B0 terminals, then raising of the CAC terminal of one assembly to the 60 volt level as aforesaid simultaneously raises the CAC terminals of all corresponding call button assemblies to the same 60 volt level (i.e. because the CAC terminals of each of the corresponding assemblies are connected to one another via the Otis Elevator controller). This causes the other call button assemblies (containing circuitry identical to that depicted in FIG. 2) to forward conduct through their reverse blocking diodes $D_3$ and photo diodes $D_4$. In each call button assembly, photo diode $D_4$ is optically coupled to $SCR_1$ of the same assembly. When photo diode $D_4$ of any assembly forward conducts, that assembly's silicon controlled rectifier $SCR_1$ fires, thus illuminating that assembly's light emitting diode $LED_1$ as aforesaid.

If cross firing is accomplished by common connections through the −30 volt lines between the Otis Elevator controller and each call button assembly in a group of corresponding assemblies, then the required 30 volt drop is provided by a "voltage dropping means", namely zener diode $ZD_1$. The cross firing operation is otherwise identical to that described above for the situation in which cross firing is accomplished via common connections through the B0 line.

When an elevator car arrives at the floor to which it was summoned by pressing button $PB_1$, the previously illuminated light emitting diode $LED_1$ of the call button assembly used to summon the elevator must be extinguished, together with the light emitting diodes of any corresponding assemblies illuminated by cross firing. This is to indicate that the elevator call circuitry has been reset so that passengers may summon another elevator car after the just-arrived car has departed. Resetting is accomplished by the Otis Elevator controller, which applies the positive peaks of a 150 volt alternating current signal to the illuminated call button assembly's CAC terminal. These peaks are applied via a "third electronic switch means", namely positive cancelling diode $D_2$ to $SCR_1$, thereby turning off $SCR_1$, which in turn prevents current flow through $LED_1$, thus extinguishing $LED_1$. A "charge storage means", namely soft extinguishing capacitor $C_2$ is connected in parallel across $LED_1$. The charge stored by capacitor $C_2$ is slowly dissipated through $LED_1$, thereby causing the light emitted from $LED_1$ to be gradually extinguished. This yields a more pleasing appearance than would be obtained if $LED_1$ were instantaneously extinguished upon turning off of $SCR_1$.

The following table lists the values of components included in the preferred embodiment of the invention illustrated in FIG. 2.

|  | Component | Value |
|---|---|---|
| Diodes: | $D_1$, $D_2$, $D_3$ | 1000 volt, 1 amp |
|  | $ZD_1$ | 30 volt, 5 watt |
|  | $LED_1$ | Liteon TM LTL-307C |
| Opto isolator: | ($SCR_1$ & $D_4$) | Gen. Elec. H11C6 |
| Resistors: | $R_1$ | 100 KΩ |
|  | $R_2$ | 12 KΩ |
|  | $R_3$, $R_3$ | 3.3 KΩ |

| | Component | Value |
|---|---|---|
| Capacitors: | $C_1$ | 2.2 µf |
| | $C_2$ | 47 µf |

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A replacement elevator call button unit connectible to an elevator controller having first and second power supply lines and having an elevator call registering terminal, said unit comprising:
    (a) first semi-conductor switch means electrically connectible between said power supply lines, said first switch means for switching between an operative state permitting current flow between said power lines, and an inoperative state preventing current flow between said power lines;
    (b) a push button electrically coupled to said first switch means for switching said first switch means from said inoperative state to said operative state upon depression of said button;
    (c) voltage divider means for electrical connection across said elevator call registering terminal, in series with said first switch means;
    (d) illuminating means electrically connected to said first switch means, for illuminating said push button upon said switching of said first switch means from said inoperative state to said operative state; and,
    (e) second semi-conductor switch means optically coupled to said first switch means and for switching said first switch means from said inoperative state to said operative state upon application of a first predetermined signal to said call registering terminal by said elevator controller, said second switch means being electrically connectible between said call registering terminal and said second power supply line.

2. A replacement elevator call button unit as defined in claim 2, further comprising third semi-conductor switch means electrically connectible between said call registering terminal and said first switch means, for switching said first switch means from said operative state to said inoperative state upon application of a second predetermined signal to said call registering terminal by said elevator controller.

3. A replacement elevator call button unit as defined in claim 2, further comprising voltage dropping means for dropping the voltage between said second power supply line and a third power supply line of said elevator controller.

4. A replacement elevator call button unit as defined in claim 2, further comprising charge storage means connected across said illuminating means, said charge storage means for gradually extinguishing said illuminating means upon switching of said first switch means from said operative state to said inoperative state.

5. A replacement elevator call button unit as defined in claim 2, wherein:
    (a) said first switch means comprises a silicon controlled rectifier;
    (b) said voltage divider means comprises a pair of series connected resistors;
    (c) said second switch means comprises a photo diode; and,
    (d) said third switch means comprises a diode.

6. A replacement elevator call button unit connectible to an elevator controller having first and second power supply lines and having an elevator claim registering terminal, said unit comprising:
    (a) a silicon controlled rectifier having a gate, an anode electrically connectible to said first power supply line and a cathode electrically connectible to said second power supply line;
    (b) a normally open push button electrically coupled between said first power supply line and said gate;
    (c) a voltage divider electrically connectible across said elevator call registering terminal, between said cathode and said second power supply line;
    (d) a light emitting diode having an anode electrically connected to said silicon controlled rectifier cathode and having a cathode electrically connectible to said second power supply line; and,
    (e) a photo diode optically coupled to said silicon controlled rectifier, said photo diode having an anode electrically connectible to said call registering terminal and having an anode electrically connected to said second power supply line.

7. A replacement elevator call button unit as defined in claim 6, further comprising a diode having an anode electrically connectible to said call registering terminal and having a cathode electrically connected to said silicon controlled rectifier cathode.

8. A replacement elevator call button unit as defined in claim 7, further comprising a zener diode electrically connectible between said second power supply line and a third power supply line of said elevator controller.

9. A replacement elevator call button unit as defined in claim 7, further comprising a capacitor electrically connected across said light emitting diode.

* * * * *